United States Patent
Sartschev

(10) Patent No.: US 7,323,898 B2
(45) Date of Patent: Jan. 29, 2008

(54) PIN ELECTRONICS DRIVER

(75) Inventor: Ronald A. Sartschev, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 110 days.

(21) Appl. No.: 11/183,382

(22) Filed: Jul. 18, 2005

(65) Prior Publication Data

US 2007/0018681 A1    Jan. 25, 2007

(51) Int. Cl.
*G01R 31/02* (2006.01)
(52) U.S. Cl. ............ 324/765; 324/763; 327/291; 327/108; 330/263
(58) Field of Classification Search ............. 324/754, 324/765

See application file for complete search history.

(56) References Cited

U.S. PATENT DOCUMENTS

| | | | |
|---|---|---|---|
| 5,357,211 A | | 10/1994 | Bryson et al. |
| 5,377,202 A | * | 12/1994 | Bryson et al. ............ 714/740 |
| 5,500,615 A | * | 3/1996 | Barter ...................... 327/111 |
| 5,842,155 A | * | 11/1998 | Bryson et al. ............ 702/124 |
| 5,973,542 A | | 10/1999 | Okayasu et al. |
| 6,130,563 A | * | 10/2000 | Pilling et al. ............. 327/111 |
| 6,232,815 B1 | | 5/2001 | Turvey |
| 6,313,682 B1 | * | 11/2001 | Muller et al. ............. 327/291 |

OTHER PUBLICATIONS

International Search Report for Application No. PCT/US2006/020079, dated Sep. 20, 2006.
Written Opinion for Application No. PCT/US2006/020079, dated Sep. 20, 2006.
International Preliminary Report on Patentability for Application No. PCT/US2006/020079, dated Jun. 12, 2007.

* cited by examiner

*Primary Examiner*—Vibol Tan
(74) *Attorney, Agent, or Firm*—Fish & Richardson P.C.

(57) ABSTRACT

Circuitry for driving a pin includes a first resistive circuit connected to the pin, a first transistor circuit to connect the first resistive circuit to a logic level voltage in response to a trigger voltage, the first transistor circuit and the first resistive circuit together defining a termination impedance, and a driver circuit to apply the trigger voltage to the first transistor circuit. The driver circuit includes counterparts to the first resistive circuit and the first transistor circuit. The counterparts define a counterpart impedance that is controlled to control the trigger voltage and thereby control the termination impedance.

17 Claims, 5 Drawing Sheets

PIN ELECTRONICS DRIVER

TECHNICAL FIELD

This patent application relates generally to a pin electronics driver.

BACKGROUND

Automatic test equipment (ATE) refers to an automated, usually computer-driven, apparatus for testing devices, such as semiconductors, electronic circuits, and printed circuit board assemblies. A device tested by ATE is referred to as a device under test (DUT).

A pin electronics driver in ATE configures signal pins to output voltages to the DUT and to receive voltages from the DUT. Implementing a pin electronics driver using complementary metal oxide semiconductor (CMOS) technology can be advantageous because it results in less power consumption by the ATE. In more detail, CMOS technology uses both N-channel and P-channel transistors. During operation of a CMOS device, only one of the two types of transistors is "on" at any given time. As a result, CMOS devices require less power than devices that use only a single type of transistor.

One difficulty associated with implementing a CMOS pin electronics driver involves regulating the termination impedance of the output pins. Differences in transistor characteristics can affect the termination impedance of an output pin. For example, the transconductance and inherent capacitance of two transistors may vary, resulting in different impedances at an output pin. These differences in impedance can adversely affect the quality of signals transmitted over the output pin.

SUMMARY

This patent application describes methods and apparatus, including computer program products, for implementing a pin electronics driver.

In general, in one aspect, the invention is directed to circuitry for driving a pin that includes a first resistive circuit connected to the pin, a first transistor circuit to connect the first resistive circuit to a logic level voltage in response to a trigger voltage, where the first transistor circuit and the first resistive circuit together define a termination impedance, and a driver circuit to apply the trigger voltage to the first transistor circuit. The driver circuit includes counterparts to the first resistive circuit and the first transistor circuit. The counterparts define a counterpart impedance that is controlled to control the trigger voltage and thereby control the termination impedance.

The foregoing aspect may also include one or more of the following features.

The counterparts may include a second transistor circuit, and a second resistive circuit in series with the second transistor circuit. The second transistor circuit and the second resistive circuit together may define the counterpart impedance. The driver circuit may include operational amplifier having a first input and a second input. The first input may receive a reference voltage. The second resistive circuit may be used in generating a determined voltage. The second input may receive the determined voltage. The operational amplifier may apply an output voltage to the second transistor circuit. The output voltage may be based on the reference voltage and the determined voltage. The output voltage may regulate the counterpart impedance.

The second transistor circuit may include a transistor having a source, a gate, and a drain. The output voltage may be applied to the gate to transfer an input voltage from the source to the drain. The first resistive circuit may include resistors arranged in parallel. The second resistive circuit may include resistors arranged in parallel, and the first transistor circuit may include transistors having gates arranged in parallel. The second transistor circuit may include one transistor.

The driver circuit may include a first resistor network that is configurable to correspond to the termination impedance, and a second resistor network that is configurable to substantially match the first resistor network. A voltage across the second resistor network may be used in generating the determined voltage.

The first transistor circuit may include one of a P-channel FET and an N-channel FET. A second transistor circuit may be used to connect the first resistive circuit to a second logic level voltage in response to a second trigger voltage. The second transistor circuit and the first resistive circuit together may define the termination impedance. A second driver circuit may be used to apply the second trigger voltage to the second transistor circuit. The second driver circuit may include counterparts to the first resistive circuit and the second transistor circuit. The counterparts may define a counterpart impedance that is controlled to control the second trigger voltage and thereby control the termination impedance. A switch may be included between the driver circuit and the first transistor circuit. Logic may be used to close the switch and thereby apply the trigger voltage to the first transistor circuit, or to open the switch and thereby prevent the trigger voltage from reaching the first transistor circuit.

In general, in another aspect, the invention is directed to automatic test equipment (ATE) that includes a pin over which signals are transmitted, a first circuit connected to the pin and having a first impedance that is adjustable, a second circuit having a second impedance that is adjustable, where the second circuit is used in generating a determined voltage in response to an input, and an amplifier that provides an output voltage in response to the determined voltage and the reference voltage. The output voltage is fed back to the second circuit to adjust the second impedance or being applied to the first circuit to adjust the first impedance. This aspect may also include one or more of the following features.

The first circuit may be a first resistive circuit and a first transistor circuit. The first transistor circuit may include at least one gate that receives the output voltage. The first resistive circuit may include resistors arranged in parallel. The second circuit may include a second resistive circuit and a second transistor circuit. The second transistor circuit may include at least one gate that receives the output voltage. The ATE may include feedback path from the amplifier to the at least one gate. The feedback path may provide the output voltage to the at least one gate. The second circuit may have a same combination of components as the first circuit. The ATE may include first resistor network that is configurable to substantially match the first impedance, and a second resistor network that is configurable to substantially match the first resistor network. A voltage across the second resistor network may be used in generating the determined voltage.

In general, in another aspect, the invention is directed to a method of regulating impedance of a pin over which signals pass in automatic test equipment. The method includes controlling an impedance of a first circuit by applying a feedback voltage to a gate of a first transistor in the first circuit, where the first circuit is used to generate a first voltage, using the first voltage and a reference voltage to generate an output voltage, and applying the output voltage to a second circuit connected to the pin. The output voltage may be applied to a gate of a second transistor in the second circuit to control an impedance of the second circuit. The feedback voltage may be an earlier version of the output voltage.

The foregoing aspect may also include one or more of the following features.

The first voltage may be based on an output voltage of the first circuit and a voltage across a resistor network. The resistor network may be configured to correspond to the impedance of the second circuit. The second circuit may be a resistive circuit and a transistor-based circuit. Application of the output voltage may be controlled in response to a control signal that is based on a signal from a processing device.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
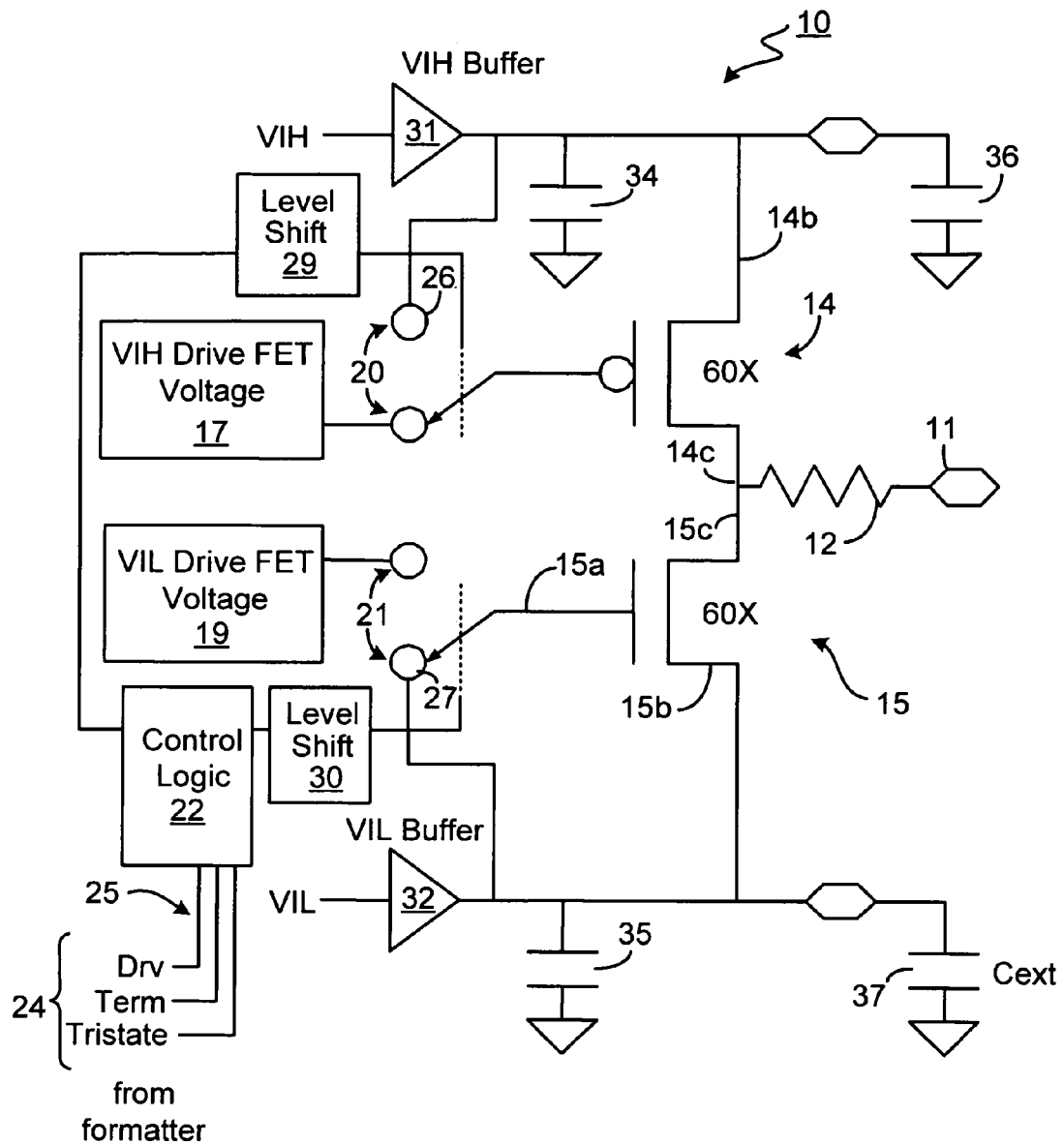
FIG. 1 is a block diagram of a pin electronics driver for use with ATE.

FIG. 1 shows circuitry 10 for a pin electronics driver of an ATE. Circuitry 10 includes a pin 11. Signals are transmitted from the ATE to a DUT over pin 11. Termination resistance 12 terminates pin 11. Although only one resistor is shown in FIG. 1, termination resistance 12 may be any type of resistive circuit and may be implemented using any number and configuration of resistors. In one implementation, termination resistance 12 includes ten 400Ω resistors connected in parallel, resulting in a combined resistance of 40Ω±4Ω, where the 4Ω represents a tolerance range. The target termination impedance in this case is 50Ω. The difference between the impedance of termination resistance 12 and the target impedance is made up by output transistors.

In this regard, circuitry 10 includes N-channel field-effect transistor (FET) circuit 15 and P-channel FET circuit 14. N-channel FET circuit 15 has a gate 15a, a source 15b, and a drain 15c. Source 15b is connected to a logic-low voltage VIL, and drain 15c is connected to termination resistance 12. Gate 15a is connected to a control voltage, which is described below. Upon application of an appropriate control voltage—in this case, a high voltage, since FET circuit 15 is N-channel—FET circuit 15 is driven to conduction. Conduction causes the VIL voltage to be provided from source 15b to drain 15c and to pin 11.

Conduction of N-channel FET circuit 15 is imperfect, meaning that there is an impedance in the source-drain path of the FET. This impedance is, in part, a function of the control voltage applied to gate 15a. Generally speaking, in an N-channel FET, lower gate voltages, e.g., at or slightly above the threshold voltage of the FET, will result in a higher impedance than higher gate voltages. The combination of the impedance across N-channel FET circuit 15 and termination resistance 12 constitutes the termination impedance for pin 11 when outputting a logic-low voltage (VIL) via pin 11.

In the circuitry of FIG. 1, when N-channel FET circuit 15 is on, P-channel FET circuit 14 is off, and vice-versa. P-channel FET circuit 14 has a gate 14a, a source 14b, and a drain 14c. Source 14b is connected to a logic-high voltage VIH, and drain 14c is connected to termination resistance 12. Gate 14a is connected to a control voltage, which is also described below. Upon application of an appropriate control voltage—in this case, a low voltage, since FET circuit 14 is P-channel—P-channel FET circuit 14 is driven to conduction. The resulting conduction causes the VIH voltage to be provided from source 14b to drain 14c, and thus to be output on pin 11.

As was the case above, conduction of P-channel FET circuit 14 is imperfect, meaning that there is impedance in the source-drain path of the FET. This impedance is, in part, a function of the control voltage applied to gate 14a. Generally speaking, in a P-channel FET, higher gate voltages, e.g., at or slightly below the threshold voltage of the FET, will results in a higher impedance than lower gate voltages. The combination of the impedance across P-channel FET circuit 14 and termination resistance 12 constitutes the termination impedance for pin 11 when outputting a logic-high voltage (VIH) via pin 11.

N- and P-channel FET circuits 14/15 have considerable capacitance, but their capacitance is mostly isolated from pin 11 by termination resistance 12. Termination resistance 12 therefore constitutes the majority of the output impedance, as indicated below. Termination resistance 12 is configured to be wide enough to carry an output current.

Figure 2:
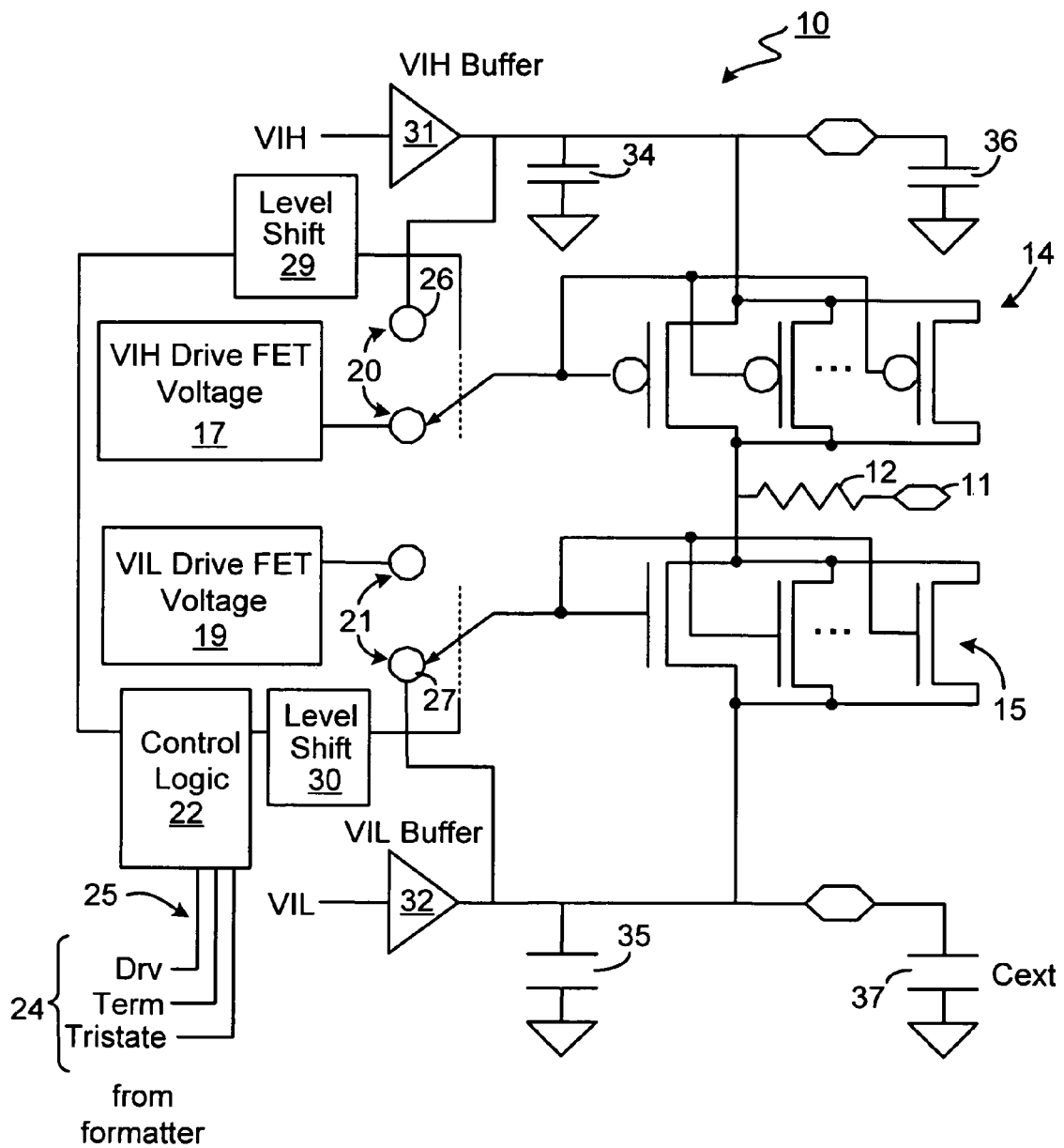
FIG. 2 is a block diagram of an alternate configuration of the pin electronics driver.

FIG. 2 provides a detailed view of the output transistors 14 and 15. As shown in FIG. 2, N-channel FET circuit 15 and P-channel FET circuit 14 circuit may each include more than one FET, even though only one FET is shown for each circuit in FIG. 1. For example, in one implementation, N-channel FET circuit 15 includes sixty identical N-channel FETs arranged with their gates, drains and sources in parallel. Likewise, in this implementation, P-channel FET circuit 14 includes sixty identical P-channel FETs arranged with their gates, drains and sources in parallel.

In FIG. 1, VIH driver 17 provides the control voltage to P-channel FET circuit 14, and VIL driver 19 provides the control voltage to N-channel FET circuit 15. The structure and function of these drivers is described in more detail below with respect to FIGS. 3A and 3B. Switch 20 is between VIH driver 17 and P-channel FET circuit 14, and switch 21 is between VIL driver 19 and N-channel FET circuit 15. When closed, switch 20 allows the control voltage to pass from VIH driver 17 to P-channel FET circuit 14, and when open, switch 20 prevents the control voltage from reaching P-channel FET circuit 14. Switch 21 operates in the same manner for VIL driver 19 and N-channel FET circuit 15. Switches 20, 21 may be implemented using transistors or other electrical and/or mechanical elements.

Logic 22 controls switches 20, 21 in accordance with control signals 24 received from a processing device, such as a digital signal processor (DSP), computer, or the like (not shown). These controls signals include a drive (DRV) signal 25 which, when a high logic level is to be applied to pin 11, instructs logic 22 to close switch 20 and to open switch 21.

In this context, switch 20 is considered closed when connected to VIH driver 17 and open when connected to high logic level VIH 26 (since VIH will substantially prevent conduction of P-channel FET circuit 14). When a low logic level is to be applied to pin 11, DRV signal 25 instructs logic 22 to open switch 20 and to close switch 21. Switch 21 is considered closed when connected to VIL driver 19 and open when connected to low logic level VIL 27 (since VIL will substantially prevent conduction of N-channel FET circuit 15). The timing of switches 20 and 21 should ensure that a new transistor is turned on before another one is turned off. This slows propagation delay, but ensures that pin 11 is not left floating, which can cause undershoot at the start of a voltage transition.

The other two signals, namely TERM and TRISTATE, are described in more detail below. Level shifters 29 and 30 may be used to alter the voltage levels of the outputs of control logic 22 before application to the switches.

The implementation of FIG. 1 includes buffers 31 and 32 to buffer the VIH and VIL voltages, respectively. Capacitors 34 and 36 support VIH at source 14b of P-channel FET circuit 14 and capacitors 35 and 37 support VIL at source 15b of N-channel FET circuit 15. Other circuit elements (not shown) may also be incorporated into circuitry 10.

Figure 3A:
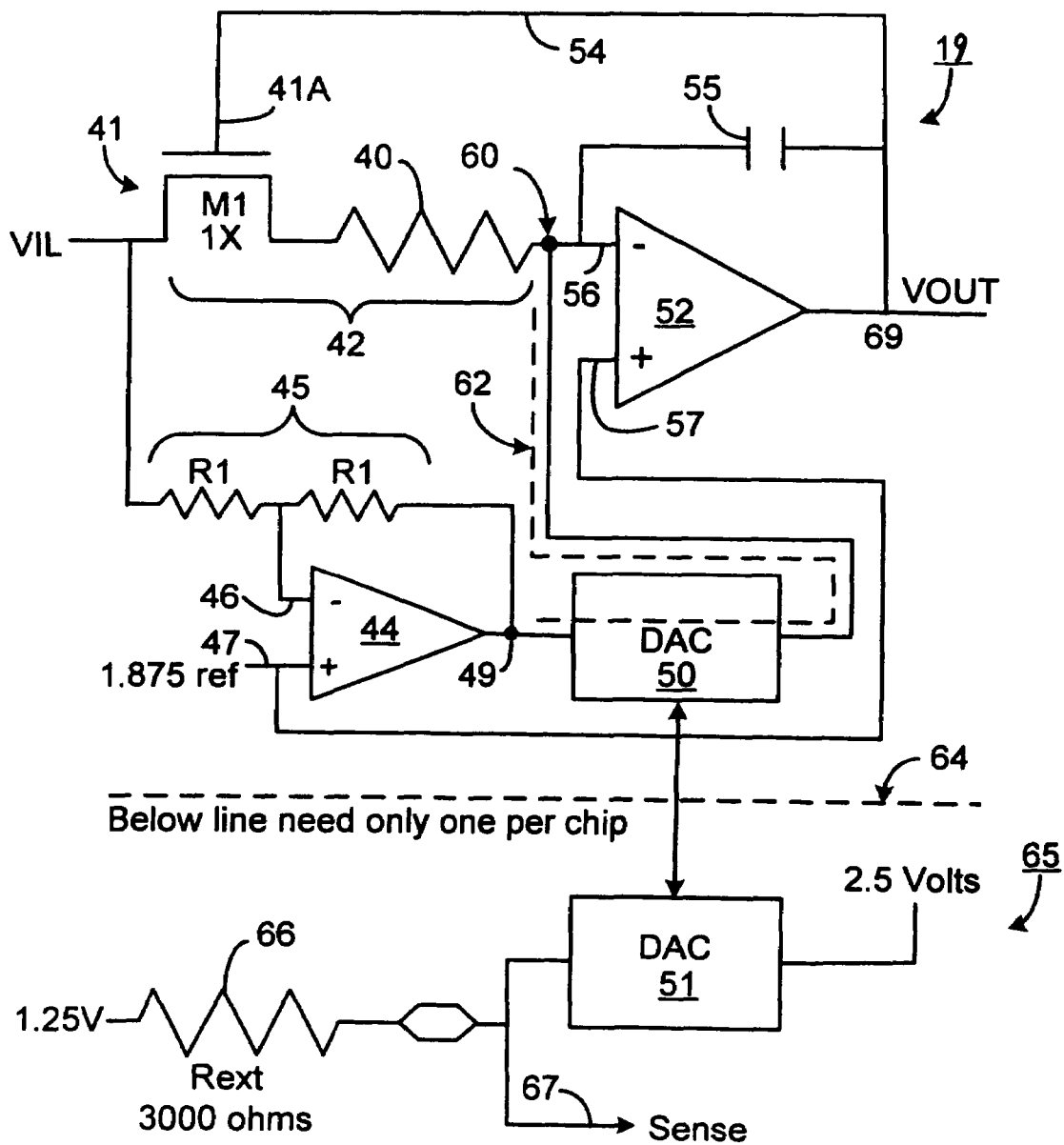
FIGS. 3A and 3B are a block diagrams of voltage drivers used in the pin electronics driver.

FIG. 3A shows an implementation of VIL driver 19. As shown in FIG. 3A, VIL driver 19 includes a resistive circuit 40 and a transistor circuit 41. Although only one resistor is shown in FIG. 3A, resistive circuit 40 may be implemented using numerous resistors. In the implementation of FIG. 3A, resistive circuit 40 actually includes six 400Ω resistors connected in series, resulting in a combined resistance of 2400Ω±240Ω, where the 240Ω deviation represents inherent tolerances of the resistors. Thus, resistive circuit 40 has about sixty times the resistance of termination resistance 12 (FIG. 1).

In this implementation, transistor circuit 41 includes one N-channel FET. Transistor circuit 41 has about ⅟₆₀th of the transconductance of N-channel FET circuit 15 (FIG. 2), and thus about sixty times the resistance of N-channel FET circuit 15. Because circuit 15 was implemented with 60 parallel devices, circuit 41 is implemented with just one to achieve ⅟₆₀ of the impedance. Thus, circuit path 42, which includes transistor circuit 41 and resistive circuit 40, carries roughly ⅟₆₀th of the current of the output circuit path that includes N-channel FET circuit 15 and termination resistance 12. Thus, calibrating impedance requires relatively little current, as explained below.

VIL driver 19 also includes an inverting operating amplifier 44 having a resistive voltage divider circuit 45. Amplifier 44 includes two inputs 46 and 47. At one input (+), amplifier 44 receives a reference voltage, in this case, 1.875V. At another input (−), amplifier 44 receives a stepped-down version of VIH. At node 49, amplifier 44 outputs a difference between the reference voltage and VIH, here 1.875V−VIH.

The output of amplifier 44 is applied to the input of resistor DAC (digital-to-analog converter) 50. Here, DAC 50 includes a programmable resistor network. The resistance of DAC 50 can be controlled by switching resistors into, or out of, the network. DAC 50 is programmed to reflect the configuration of a master DAC 51 (described below).

VIL driver 19 also includes an operational amplifier 52 with a feedback path 54 and a storage capacitor 55 across the amplifier. Amplifier 52 contains two input terminals 56 and 57. Input terminal (+) 56 receives a reference voltage, which is 1.875V in this implementation. Input terminal (−) 57 receives the voltage at node 60, which may be referred to as a "determined voltage". The voltage at node 60 is a combination of the voltage across circuit paths 42 and 62. As described below, transistor circuit 41 is controlled to control its impedance so that the impedance across resistive circuit 40 and transistor circuit 41 matches the impedance of DAC 50.

In this implementation, DAC 50 is programmed to have an impedance that correlates to the impedance of N-channel FET transistor circuit 15 and termination resistance 12. In this implementation, DAC 50 is programmed to have an impedance of 3000Ω. This is sixty times the target impedance of P-channel FET circuit 14 and termination resistance 12, which enables calibration of the termination impedance of pin 11 to be performed using relatively little current, as explained below.

DAC 50 is programmed using master DAC 51. In FIG. 3A, the circuitry shown above line 64 is provided for each pin (channel) of the ATE. Accordingly, the ATE contains numerous "slave" DACs (e.g., DAC 50). The circuitry 10 below line 64, including master DAC 51, is not provided for each pin. Circuitry 10 may be provided only once on the ATE.

Master DAC 51 is similar in structure and function to DAC 50. Master DAC 51 is used to program DAC 50 and others like it on the ATE. Master DAC 51 is programmed to have the same impedance as an external resistor (Rext) 66. In this context, programming includes adding, or removing, individual resistors from a resistor network in the DAC. The resistor configuration of master DAC 51 is replicated in DAC 50. For example, a controller or other processing device (not shown) may program DAC 50 accordingly.

In this implementation, master DAC 51 is programmed by applying 2.5V to the DAC's input terminal and 1.25V to external resistor 66, and measuring an output at sense line 67. When the sense line reaches 1.875V, which is one-half of 2.5V plus 1.25V, then master DAC 51 is deemed to be programmed to provide 3000Ω.

Since all of the DACs on the ATE will track master DAC 51, calibration of master DAC 51 can be performed at initialization of the ATE. The power used can be relatively low since relevant currents are all essentially under 1 mA. It is noted that, in this implementation, the only circuits in the ATE that dissipate quiescent power are buffer amplifiers and drivers. The remaining circuitry only draws current during a transition on the output pin. This results in relatively significant overall power reduction.

The operation of VIL driver 19 in the implementation of FIG. 3A is as follows. Amplifier 52 receives the voltage of node 60 and the reference voltage, and generates an output voltage ($V_{out}$) at output 69 based on its input voltages. Amplifier 52 also acts as an integrator to control the output voltage in response to varying current at its output 69, with capacitor 55 storing voltage. Amplifier 52 is stable when voltages applied to its positive (+) terminal 57 and its negative (−) terminal 56 match. That is, amplifier 52 outputs a substantially constant, in this case low voltage, signal when the inputs to its positive (+) terminal 57 and its negative (−) terminal 56 match. The term "match", in this context means that two voltages are either the same or within a preset tolerance of each other.

Feedback path 54 is used to adjust the impedance of transistor circuit 41 so that the combined impedance of transistor circuit 41 and resistive circuit 40 matches, or at least substantially matches, the impedance of DAC 50. As noted above, the impedance of DAC 50 is proportional—in this case sixty times—the combined impedance of termination resistance 12 and N-channel FET circuit 15 (FIG. 1).

Thus, feedback path 54, under control of amplifier 52, adjusts the impedance of transistor circuit 41 so that the combined impedance of transistor circuit 41 and resistive circuit 40 matches, or at least substantially matches, the combined impedance of termination resistance 12 and N-channel FET circuit 14 times sixty. The factor of sixty is used to reduce the amount of current through circuit path 42. That is, resistive circuit 40 has sixty times, or close to sixty times, the impedance of termination resistance 12, and transistor circuit 41 is controlled so that its source-drain impedance is sixty times, or close to sixty times, the source-drain impedance of N-channel FET circuit 15. This increased impedance results in a reduced amount of current needed to calibrate the termination impedance of pin 11.

When the impedances of DAC 50 and transistor circuit 41/resistive circuit 40 match, the resulting voltage drops across those circuits will produce same, or substantially same, voltage inputs to the (+) and (−) terminals of operational amplifier 52. That is, the voltage at node 60 becomes a combination of voltage $V_1$ from circuit path 42 and $V_2$ from circuit path 62, where $V_1$ and $V_2$ are as follows $V_1 = VIH - (V_R + V_T)$ $V_2 = (1.875 - VIH) + VDAC$, and where $V_R$ is the voltage across resistive circuit 40, $V_T$ is the voltage across transistor circuit 41, $V_{DAC}$ is the voltage across DAC 50, and (1.875−VIH) is the voltage at node 49. When $V_{DAC}$ is equal to $V_R + V_T$, the resulting voltage at node 60, and thus at (−) terminal 56, is 1.875. This is equal to the constant 1.875 voltage at (+) terminal 57.

The voltage, $V_{out}$, that is used to control the impedance of P-channel FET circuit 14 is applied, via feedback path 54, to gate 41a of transistor circuit 41. This voltage, $V_{out}$, controls the source-drain conductivity, and thus the source-drain impedance, of transistor circuit 41. As explained above, the source-drain impedance of transistor circuit 41 is controlled so that the combined source-drain impedance of transistor circuit 41 and resistive circuit 40 matches the impedance of DAC 50.

Figure 3B:
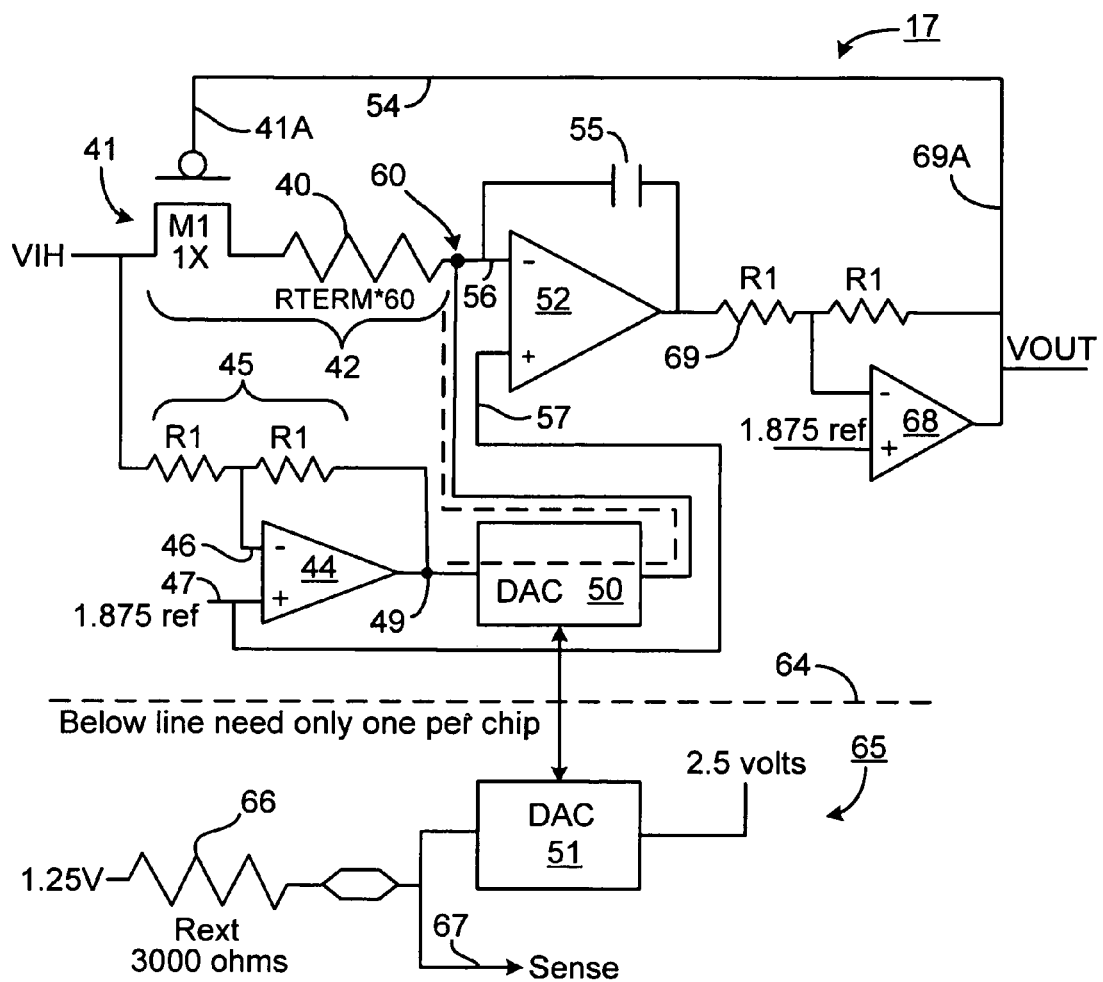

As noted above, FIG. 3A shows VIL driver 19 of FIG. 1. FIG. 3B shows similar circuitry which is used to implement VIH driver 17, with the impedance of the transistor circuit in being controlled based on the impedance of P-channel FET circuit 14. An inverting op-amp 68 at output 69 of amplifier 52, is included in VIH driver 17 to invert the value of $V_{out}$, since VIH driver 17 is driving an P-channel transistor circuit 41. The output of the circuit is the inverted output of this op-amp which is node 69A.

In the implementation described above, 0V<VIH<3.7V and −0.7V<VIL<3.0V. It is noted, however, that circuitry 10 can be used with any VIH and VIL values.

Figure 4:
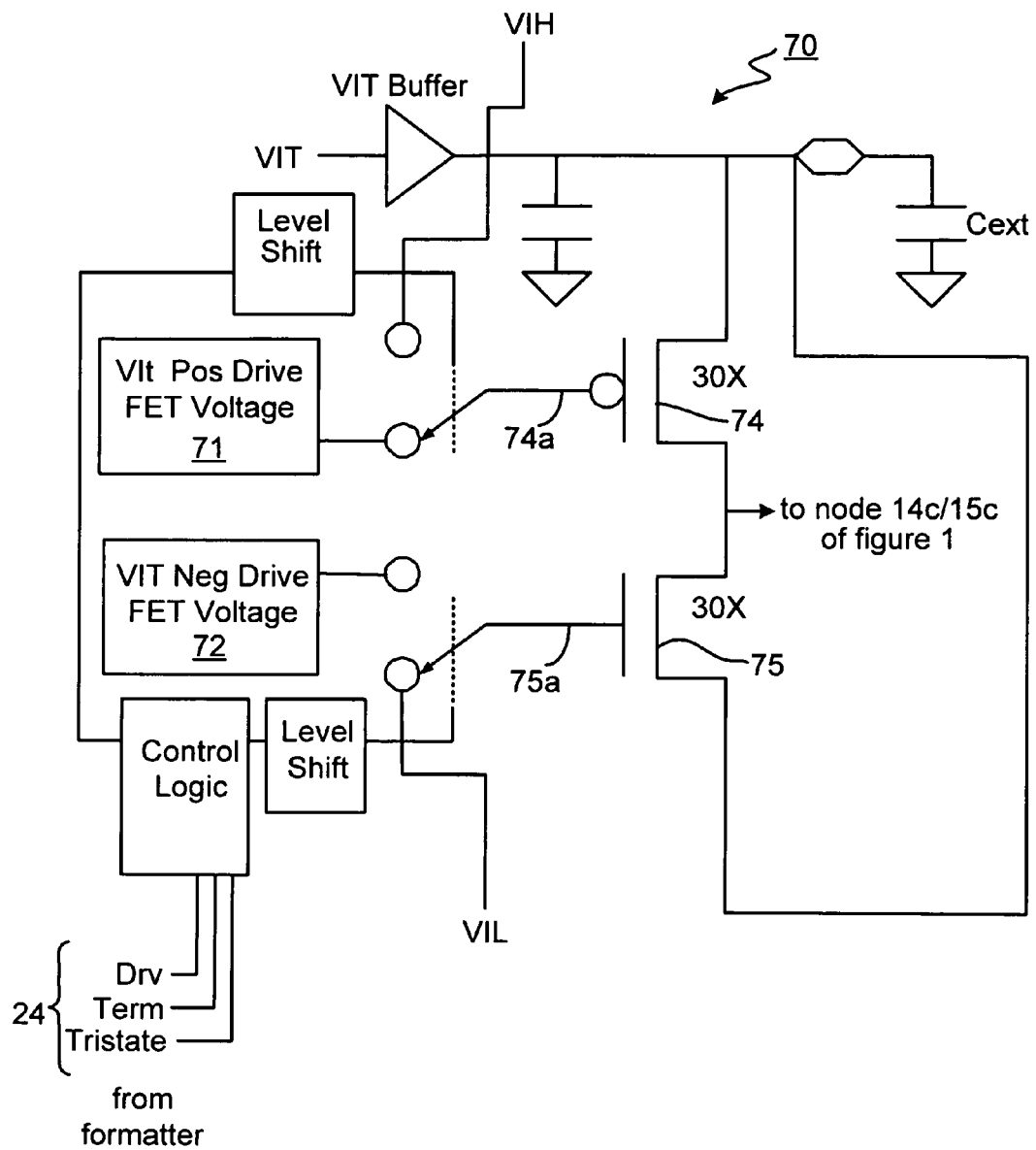
FIG. 4 is a block diagram of a termination driver for use with ATE.

FIG. 4 shows circuitry 70 for implementing a termination driver. In this context, a termination driver is a special type of pin electronics driver. Termination driver 70 may be used to terminate ATE pins that receive signals from a DUT, or pins that are bi-directional, i.e., pins that both transmit signals to, and receive signals from, a DUT.

Circuitry 70 has substantially the same structure as circuitry 10 of FIG. 1. In circuitry 70, VIT positive driver 71 corresponds to, and has substantially the same structure and function as, VIH driver 17; and VIT negative driver 72 corresponds to, and has substantially the same structure and function as, VIL driver 19. "VIT" refers to a termination voltage, which may be between VIH and VIL.

In circuitry 70, however, the source-drain impedance of each of P-channel FET circuit 74 and N-channel FET circuit 75 is one-half of the source-drain impedance of P-channel FET circuit 14 or N-channel FET transistor circuit 14 (FIG. 1). This is because termination driver 70 operates by connecting the output of VIT positive driver 71 to P-channel FET circuit 74 and the output of VIT negative driver 72 to N-channel FET circuit 75 at the same time (whereas, above, only one of VIH or VIL driver is connected). The combined circuit is connected to node 14c/15c in FIG. 1, just before the termination resistor 12 of FIG. 1. The resulting termination impedance at output 11 includes the impedance of both N- and P-channel FET circuits 74 and 75, in addition to termination resistance 12.

Since the output impedance of each of N-channel FET circuit 75 and P-channel FET circuit 74 (FIG. 4) is one-half the output impedance of N-channel FET circuit 15 or P-channel FET circuit 14 (FIG. 1), VIT positive driver 71 (FIG. 4) controls the source-drain impedance of its transistor circuit so that the combined impedance of its resistive circuit and its transistor circuit is thirty times the output impedance of P-channel FET circuit 74, as opposed to sixty times in the example of FIG. 1. VIL negative driver 72 also controls the source-drain impedance of its transistor circuit so that the combined impedance of its resistive circuit and its transistor circuit is thirty times the output impedance of N-channel FET circuit 75. Here, the transistor circuit and the resistive circuit refer to counterparts to 40 and 41 of FIG. 3A and FIG. 3B. The resulting matched impedances produce output voltages that control the impedances of N-channel FET circuit 75 and P-channel FET circuit 74 in the manner described above, thereby controlling the termination impedance.

Termination driver 70 is controlled via the TERM signal noted above. The TRISTATE signal also can be used to control termination driver 70 or the pin electronics driver of FIG. 1. The TRISTATE signal prevents output transistors from conducting, thereby leaving the DUT pin floating. In FIG. 1, in response to the TRISTATE signal, circuitry 10 connects gate 14a to VIH and gate 15a to VIL. In FIG. 3A, in response to the TRISTATE signal, circuitry 70 connects gate 75a to VIL. In FIG. 3B, in response to the TRISTATE signal, circuitry 70 connects gate 74a to VIH.

The ATE described herein is not limited to use with the hardware described above. At least part of the ATE can be implemented in other analog or digital electronic circuitry, or in computer hardware, firmware, software, or in combinations thereof.

At least part of the ATE can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing at least part of the ATE can be performed by one or more programmable processors executing one or more computer programs to perform at least some functions of the ATE. All or part of the ATE can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The pin electronics circuitry described herein is not limited to use with the particular values used, including reference voltages, impedances, and the like noted herein, but rather can be implemented using any combination of such values.

Elements of different embodiments described herein may be combined to form other embodiments not specifically set forth above. Other embodiments not specifically described herein are also within the scope of the following claims.

What is claimed is:

1. Circuitry for driving a pin, the circuitry comprising:
   a first resistive circuit connected to the pin;
   a first transistor circuit to connect the first resistive circuit to a logic level voltage in response to a trigger voltage, the first transistor circuit and the first resistive circuit together defining a termination impedance;
   a driver circuit to provide the trigger voltage for the first transistor circuit, the driver circuit comprising a second transistor circuit and a second resistive circuit in series with the second transistor circuit, the second transistor circuit and the second resistive circuit together defining a driver impedance that is controlled to control the trigger voltage and thereby control the termination impedance;
   a switch between the driver circuit and the first transistor circuit; and
   logic to close the switch and thereby apply the trigger voltage to the first transistor circuit, or to open the switch and thereby prevent the trigger voltage from reaching the first transistor circuit.

2. The circuitry of claim 1, wherein the driver circuit comprises an operational amplifier having a first input and a second input, the first input receiving a reference voltage;
   wherein the second resistive circuit is used in generating a determined voltage, the second input receiving the determined voltage; and
   wherein the operational amplifier applies an output voltage to the second transistor circuit, the output voltage being based on the reference voltage and the determined voltage, the output voltage regulating the driver impedance.

3. The circuitry cf claim 2, wherein the second transistor circuit comprises a transistor having a source, a gate, and a drain; and
   wherein the output voltage is applied to the gate to transfer an input voltage from the source to the drain.

4. The circuitry of claim 1, wherein:
   the first resistive circuit comprises resistors arranged in parallel;
   the second resistive circuit comprises resistors arranged in parallel; and
   the first transistor circuit comprises transistors having gates arranged in parallel.

5. The circuitry of claim 4, wherein the second transistor circuit comprises one transistor.

6. The circuitry of claim 2, wherein the driver circuit comprises:
   a first resistor network that is configurable to correspond to the termination impedance; and
   a second resonator network that is configurable to substantially match the first resistor network, a voltage across the second resistor network being used in generating the determined voltage.

7. The circuitry of claim 1, wherein the first transistor circuit comprises one or a P-channel FET and an N-channel FET.

8. The circuitry of claim 1, further comprising:
   a third transistor circuit to connect the first resistive circuit to a second logic level voltage in response to a second trigger voltage, the third transistor circuit and the first resistive circuit together defining the termination on impedance; and
   a second driver circuit to provide the second trigger voltage for the third transistor circuit, the second driver circuit comprising a fourth transistor circuit and a third resistive circuit in series with the fourth transistor circuit, the fourth transistor circuit and the third resistive circuit together defining a second driver impedance that is controlled to control the second trigger voltage and thereby control the termination impedance.

9. Automatic test equipment (ATE) comprising;
   a pin over which signals are transmitted;
   a first circuit connected to the pin and having a first impedance that is adjustable;
   a second circuit having a second impedance that is adjustable, the second circuit being used in generating a determined voltage in response to an input; and
   an amplifier that provides an output voltage in response to the determined voltage and a reference voltage, the output voltage being fed back to the second circuit to adjust the second impedance or being applied to the first circuit to adjust the first impedance;
   wherein the first circuit comprises a first we circuit arc a first transistor circuit, the first transistor circuit comprising at least one gate that receives the output voltage.

10. The ATE of claim 9, wherein the first resistive circuit comprises resistors arranged in parallel.

11. The ATE of claim 9, wherein the second circuit comprises a second resistive circuit and a second transistor circuit, the second transistor circuit comprising at least one gate that receives the output voltage.

12. The ATE of claim 11, further comprising:
   a feedback path from the amplifier to the at least one gate of the second transistor circuit,
   the feedback path providing the output voltage to the at least one gate of the second transistor circuit.

13. The ATE of claim 9, wherein the second circuit has a same combination of components as the first circuit.

14. The ATE of claim 9, further comprising
   a first resistor network that is configurable to substantially match the first impedance; and
   a second resistor network that is configurable to substantially match an impedance of the first resistor network, a voltage across the second resistor network being used in generating the determined voltage.

15. A method of regulating impedance of a pin over which signals pass in automatic test equipment, time method comprising;
   controlling an impedance of a first circuit by applying a feedback voltage to a gate of a first transistor in the first circuit, the first circuit being used to generate a first voltage;
   using the first voltage and a reference voltage to generate an output voltage; and
   applying the output voltage to a second circuit connected to the pin, the output voltage being applied to a gate of a second transistor in the second circuit to contort an impedance of the second circuit;

wherein the feedback voltage comprises an earlier version of the output voltage.

16. The method of claim 15, wherein the first voltage is based on an output voltage of the first circuit and a voltage across a resistor network, the resistor network being configured to correspond to the impedance of the second circuit; wherein the second circuit comprises a resistive circuit and a transistor-based circuit.

17. The method of claim 15, further comprising:
controlling application of the output voltage in response to a control signal that is based on a signal from a processing device.

* * * * *